(12) United States Patent
Grosse et al.

(10) Patent No.: US 8,311,793 B2
(45) Date of Patent: Nov. 13, 2012

(54) METHOD FOR EVALUATING A TEST PROGRAM QUALITY

(75) Inventors: Joerg Grosse, Schliersee-Neuhaus (DE); Mark Hampton, La Cote St. Andre (FR)

(73) Assignee: Springsoft USA, Inc., San Jose, CA (US)

( * ) Notice: Subject to any disclaimer, the term of this patent is extended or adjusted under 35 U.S.C. 154(b) by 1018 days.

(21) Appl. No.: 11/658,930

(22) PCT Filed: Jul. 28, 2005

(86) PCT No.: PCT/DE2005/001349
§ 371 (c)(1),
(2), (4) Date: Sep. 21, 2009

(87) PCT Pub. No.: WO2006/012875
PCT Pub. Date: Feb. 9, 2006

(65) Prior Publication Data
US 2010/0057424 A1    Mar. 4, 2010

(30) Foreign Application Priority Data

Jul. 30, 2004    (DE) .......................... 10 2004 037 402

(51) Int. Cl.
*G06F 17/50* (2006.01)
(52) U.S. Cl. .............................. 703/14; 703/13; 716/106
(58) Field of Classification Search .............. 703/13–14; 716/106
See application file for complete search history.

(56) References Cited

U.S. PATENT DOCUMENTS

| 2004/0059977 A1* | 3/2004 | Liau .............................. 714/741 |
| 2004/0158788 A1* | 8/2004 | Kaszynski et al. ............. 714/741 |
| 2005/0166096 A1* | 7/2005 | Yount et al. ..................... 714/38 |

FOREIGN PATENT DOCUMENTS
DE    19959157 A1    8/2000

OTHER PUBLICATIONS

Vado et al. "A Methodolgy for Validating Digital Circuits with Mutation Testing"., 2000 IEEE., May 2000., p. I-343-I-346.*
Offutt., "Investigations of the Software Testing Coupling Effect"., 1992 ACM. Jan. 1992., 16 Pages.*

* cited by examiner

*Primary Examiner* — Eunhee Kim
(74) *Attorney, Agent, or Firm* — McDermott Will & Emery LLP

(57) ABSTRACT

The disclosure relates to a method for rating the quality of a test program for integrated circuits simulated by means of a computer. The method includes provision of a first file which describes an integrated circuit; simulation of a mutated integrated circuit which is obtained by incorporating mutations into the integrated circuit described in the first file; supplying input values to the mutated integrated circuit and recording of the output values produced for these input values by the mutated integrated circuit; comparison of the output values produced by the mutated integrated circuit with expected values which are provided by the test program, where the expected values have been generated in a reference system; and rating of the quality of the test program on the basis of the comparison results.

15 Claims, 6 Drawing Sheets

Fig. 2

```
library IEEE;
use IEEE.std_logic_1164.all; -- import std_logic types
 use IEEE.std_logic_arith.all; -- import add/sub of std_logic_vector ENTITY counter_updown is
PORT ( -- Counter Control Signals
        clock              : IN  std_logic;   -- counter clock
        reset              : IN  std_logic;   -- counter reset
        updown             : IN  std_logic;   -- count direction up/down
        count              : IN  std_logic;   -- count enable
       -- Counter Output Signals
        c0, c1, c2, c3     : OUT std_logic);  -- counter bit 0..3
END counter_updown;

ARCHITECTURE rtl OF counter_updown IS
  -- internal signal declaration
  SIGNAL counter : std_logic_vector(3 DOWNTO 0);
   BEGIN count_process : PROCESS
   -- This process builds the counter
   BEGIN
    -- wait for rising edge of clock (0->1)
   WAIT UNTIL clock'EVENT AND clock = '1';
   IF reset = '0' THEN
      -- set all counter bits to zero
       counter <= (others => '0');
   ELSE
     IF (count = '1') AND (updown = '1') THEN
        -- count up: n, n+1, n+2, ..., 15, 0, 1, ...
        counter <= CONV_STD_LOGIC_VECTOR(UNSIGNED(counter) + 1, 4);
     ELSIF (count = '1') AND (updown = '0') THEN
        -- count down: n, n-1, n-2, ..., 0, 15, 14, ...
        counter <= CONV_STD_LOGIC_VECTOR(UNSIGNED(counter) - 1, 4);
     ELSE
        -- hold counter in the same value as before
        counter <= counter;
     END IF;
   END IF;
   END PROCESS;

-- Connect internal counter to outputs
   c0 <= counter(0);
   c1 <= counter(1);
    c2 <= counter(2);
   c3 <= counter(3);

END rtl;
```

Fig. 3

```
library std,work;
library IEEE;
use ieee.std_logic_1164.all;
use ieee.std_logic_arith.all;
use std.standard.all;

entity counter_updown is
    port (
        -- em is the control port to enable a mutant
        em    : in std_logic_vector (3 downto 0);
        clock : in std_logic;
        reset : in std_logic;
        updown : in std_logic;
        count : in std_logic;
        c0,c1,c2,c3 : out std_logic) ;
end counter_updown ;

library std,work;
architecture rtl of counter_updown is
    signal counter : std_logic_vector(3 downto 0);
begin
    count_process : process
    begin
        wait  until (clock'event and (clock = '1'));
        -- conditional mutants
        if ((em="0011" and false) or
            (em="0100" and true) or
            (em="0101" and (not(reset = '0')))
            or (em/="0011" and em/="0100" and em/="0101" and (reset =
'0')))  then
            -- dead assign mutant
            if em="0110" then
            else
                counter <= (others => '0');
            end if;
        else
            -- conditional mutants
            if ((em="0111" and false) or
                (em="1000" and true) or
                (em="1001" and (not((count = '1') and (updown = '1'))))
                or(em/="0111" and em/="1000" and em/="1001" and ((count =
'1') and (updown = '1')))) then
                -- dead assign mutant
                if em="1010" then
                else
                    counter <= conv_std_logic_vector((unsigned(counter) +
1),4);
                end if;
            -- conditional mutants
            elsif ((em="1011" and false) or
                   (em="1100" and true) or
                   (em="1101" and (not((count = '1') and (updown = '0'))))
or
                   (em/="1011" and em/="1100" and em/="1101" and ((count =
'1') and (updown = '0')))) then
                -- dead assign mutant
```

Fig. 3 (Continuation)

```
                if em="1110" then
                else
                    counter <= conv_std_logic_vector((unsigned(counter) -
1),4);
                end if;
            else
                -- dead assign mutant
                if em="1111" then
                else
                    counter <= counter;
                end if;
            end if;
        end if;
    end process ;
    c0 <= counter(0);
    c1 <= counter(1);
    c2 <= counter(2);
    c3 <= counter(3);
end rtl ;
```

METHOD FOR EVALUATING A TEST PROGRAM QUALITY

The invention relates to a method for rating the quality of a test program for integrated circuits simulated by means of a computer.

The size and complexity of integrated circuits is constantly increasing. This also has an associated increase in errors, however.

Normally, integrated circuits are described by means of special computer languages, known as High Level Description Languages (HDLs). Customary HDLs are VHDL and Verilog. The HDL file is used to produce the layout of the circuit arrangement and the required photolithographic masks, which can be used to produce the actual circuit arrangement, automatically using special computer programs.

To avoid errors in the integrated circuits, however, it may be necessary to test the circuit arrangements described by means of the HDL file. This is done using programs which simulate the integrated circuit on the basis of the HDL file. Such programs are called simulators. Such a simulator cooperates with a unit called a test bench, the test program (i.e. computer code), which provides the input values ("input") which the integrated circuit is intended to process and compares the results of the processing (output values) in the simulated circuit with the expected results. The test program therefore describes (1) the input values (possibly in the form of signal waveforms), (2) the power and correctness criteria which are obtained after the processing of the input values in the simulated circuit, and (3) the actions which the simulator needs to perform when the results of the simulation meet the power and correctness criteria or when this is not the case.

However, the test result is fundamentally dependent on the quality and completeness of the test program. In respect of the large number of electronic components which are described in the HDL file, it is very difficult to create test benches which comply with the complexity of the simulated integrated circuit to be tested. Errors in the simulated circuit can be found only if the test program actually provides tests which relate to the erroneous region of the simulated integrated circuit. Otherwise, a positive test result can sometimes be attributable merely to inadequate testing (or verification) of the integrated circuit. It is therefore necessary to check the quality and the completeness of the test program. The already low speed of the software simulation for an integrated circuit is reduced further by tests which are intended to check the quality and completeness of the test program, however.

DE 199 59 157 A1 describes a method for simulating the functions and checking the correctness of a computer program in which mutated computer programs are produced. The computer program may have source code modules comprising functional models of an integrated circuit. The method simulates a computer program into which a syntactical mutation has been incorporated in order to establish whether this mutation within the context of the computer program is a fine or coarse mutation. If the mutation is a coarse mutation then the simulation is terminated; if the mutation is a fine mutation, on the other hand, then an attempt is made to record this mutation within a predetermined period of time. The method therefore rates the quality of a computer program by attempting to determine the influence of the mutation within the context of the computer program. To this end, the disclosed system compares the mutated computer program with the unmutated computer program. It is therefore suitable only for determining the quality of the simulation of the mutations by the test environment. The quality of the computer program which is actually to be tested can be inferred only indirectly therefrom. Errors which are already contained in the unmutated circuit can be identified only if the mutation actually affects the errors. This is not necessarily the case, however. The quality of the computer program can therefore be determined only inadequately using the proposed system.

It is an object of the invention to eliminate the drawbacks based on the prior art. In particular, it is an aim to provide a method which makes it possible to rate the quality of a test program for higher-quality integrated circuits simulated by means of a computer.

This object is achieved by the features of claim 1. Expedient refinements of the inventions can be found in the features of claims 2 to 14.

The invention provides a method for rating the quality of a test program for integrated circuits simulated by means of a computer which comprises the following:
  (a) provision of a first file which describes an integrated circuit;
  (b) simulation of a mutated integrated circuit which is obtained by incorporating mutations into the integrated circuit described in the first file;
  (c) supply of input values to the mutated integrated circuit and recording of the output values produced for these input values by the mutated integrated circuit;
  (d) comparison of the output values produced by the mutated integrated circuit with expected values which are provided by the test program, where the expected values have been generated in a reference system; and
  (e) rating of the quality of the test program on the basis of the comparison results.

The inventive method therefore compares the output values generated by the mutated integrated circuit with expected values which come from an independent source, i.e. the reference system. The expected values are intended to be generated in a reference system which is independent of the integrated circuit described in the first file. In this context, "independent" is understood to mean that the reference system is not based on the first file but rather has functional differences over the integrated circuit which are described in the first file. Advantageously, the reference system may be programmed in another programming language and/or by a second programmer.

In a first embodiment, step (b) comprises the following steps:
  (b1) production of a second file which describes the mutated integrated circuit from the first file by incorporating the mutations into the first file; and
  (b2) simulation of the mutated integrated circuit.

Alternatively, step (b) may, in a second embodiment, comprise the following steps:
  (b1) reading of the first file into the simulation program of the computer;
  (b2) mapping of the integrated circuit described in the first file in the simulation unit;
  (b3) incorporation of the mutations into the integrated circuit mapped in the simulation unit, which gives the mutated integrated circuit; and
  (b4) simulation of the mutated integrated circuit.

The first file may comprise a multiplicity of subfiles which then together describe the integrated mutated circuit.

The simulation program of the computer is the part of the computer in which the mutated integrated circuit is simulated.

In both embodiments, incorporation of the mutations into the integrated circuit comprises the following steps:
  (i) analysis of the first file in order to find the locations in the first file at which mutations can be incorporated and to determine, for each location found, the type of mutation which brings about a change in the behavior of the integrated circuit at this location;

(ii) analysis of the tests which the test program is able to execute in order to select the tests which provide input values which can address a mutation; and (iii) selection of the mutations which bring about a change in the behavior of the integrated circuit at a location found in accordance with step (i) and which can be addressed by one of the tests, and production of the mutated integrated circuit.

The expression "address a mutation" is to be understood within the context of the present invention to mean that an activated mutation may be involved in processing the input values and may play a part in generating the output values. Whether it is actually involved or plays a part, i.e. brings about an alteration in the output values, is checked by comparing the output values with the expected values.

An activated or active mutation is to be understood to mean the following: in line with the invention, the mutated integrated circuit has mutations in comparison with the integrated circuit described in the first file. These mutations are initially inactive, i.e. the integrated circuit described in the first file delivers exactly the same output values as the mutated integrated circuit, since none of the mutations is participating in processing the input values. In the course of the method, however, precisely one of the incorporated mutations is always successively activated, however, i.e. the activated mutation can participate in processing the input values. In this case, the tests which deliver the input values have been selected such that they address the activated mutation.

Tests which can address one of the selected mutations at least once are expediently combined to form a test set. Tests which can address a selected mutation at least once are subsequently also referred to as tests associated with this mutation. Test sets comprising these tests are also referred to as test sets associated with this mutation.

A mutation within the context of the present invention is understood to mean an alteration in the first file which brings about the functional alteration in the electronic circuit generated on the basis of this file. The mutation can be positioned in an instruction which is described in the file or can be distributed over a plurality of test lines in the file. Within the context of the present invention, mutations are functional mutations which are incorporated into the RTL plane (RTL=Register Transfer Level) or a higher plane (system plane or algorithmic plane) of the integrated circuit. In a text which follows, a mutation is to be understood to mean a functional mutation unless stated otherwise.

Examples of suitable types of mutation are logic negation errors, omission of logic factors, incorrect logic factors, omission of logic expressions, incorrect logic expressions, incorrect numerical values and case omissions. The mutations within the context of the present invention are deliberate alterations. Mutations which are already contained in the first file are changes over the programmer's actually intended programming aim mapped in the file. Such undeliberate mutations are intended to be identified in tests during which the integrated circuit described in the first file is simulated. However, this may only be the case with sufficient success if the text program is of sufficient quality, i.e. the undeliberate mutations can actually be identified by the test program. This capability, i.e. the capability of the test program to identify mutations, is checked by the deliberate incorporation of mutations into the first file and simulation of the mutated integrated circuit obtained. If the test program does not identify the deliberately incorporated mutations then it cannot be expected that it will be able to identify undeliberately incorporated mutations, since the test program in this case does not perform any tests which might find mutations of this type at the location at which the mutation has been deliberately incorporated. The inventive method allowing the test program first of all to be tested for its suitability to test the integrated circuit which is described in the first file is therefore a considerable qualitative improvement over the previous test methods for integrated circuits, since the test result which is obtained when the first file is tested by simulating the integrated circuit described therein is essentially dependent on the quality of the test program. If the quality of the test program is low (this is the case when it does not provide any or enough tests which are able to find the undeliberate mutations contained in the (first) file then execution of this test program gives a positive test result which does not correspond to the facts on account of the defects in the test program. The integrated circuit produced on the basis of this test result has actually not been adequately tested and may contain significant errors which result from the undeliberate mutations. By contrast, the check on the test program means that the inventive method provides a high guarantee that the integrated circuit has actually been adequately tested, since test programs with low quality, i.e. test programs which do not provide any or enough tests which are able to find the undeliberate mutations contained in the (first) file, are not used to test the first file or are altered such that they provide tests which are able to find the undeliberate mutations.

In the text which follows, a mutation is understood to mean a deliberate mutation.

As already explained, the quality of the test program is determined by comparing the generated output values, which are generated by the simulated integrated circuit, with the expected values contained in the test program. The result of this comparison may be regarded as negative if the output value obtained for a mutation equates to the expected value generated for the output value from the reference system. In this case, the mutation, which ought to have brought about an alteration in the output value, of course, has not been identified by the tests which have been performed by the test program.

By contrast, the result of the comparison may be regarded as positive if the output value obtained for a mutation is not equal to the expected value produced for the output value from the reference system. In this case, the mutation has brought about an alteration in the output value (or the alteration in the output value is based on an undeliberate mutation), which shows that the test which is performed by the test program is useful for testing the simulated circuit, since it identifies an alteration, i.e. the discrepancy between the output values generated by the simulated circuit and the expected values.

The demands which are made on the quality of the test program are naturally dependent on the stipulations which the user makes for the quality of the integrated circuit which is described in the first file. In one preferred embodiment, the quality of the test program is ascertained from the ratio of the number of positive comparison results to the number of negative comparison results. In that case, the quality of the test program can be rated as good if a positive comparison result is obtained for each incorporated mutation. Alternatively, the quality of the test program can be rated as good if the number of mutations for which a positive comparison result is obtained exceeds a prescribed value.

If the result of the comparison for a mutation is negative then the method can be continued on the basis of one of the following alternatives:

Variant 1: The expected value for this mutation is altered and then steps (b) to (e) are repeated. This makes sense particularly when it is doubtful whether the expected values which are delivered by the reference system actually correspond to the output values which are intended by the programmer of the first file.

Variant 2: The first file is altered, and then steps (b) to (e) are repeated. This makes sense particularly when the negative result is possibly attributable to undeliberate mutations in the first file which influence the deliberate mutations such that the alterations brought about by the latter do not affect the output values.

Variant 3: Tests are selected which address this mutation and provide altered input values in comparison with the previous tests, and then steps (b) to (e) are repeated. This makes sense particularly when it can be presumed that neither the reference system nor the simulated integrated circuit has been supplied with input values which resulted in expected values or output values which are appropriate in respect of the intended purpose of use of the integrated circuit.

The mutated integrated circuit can be implemented using a hardware accelerator. A preferred hardware accelerator is a field programmable gate array (FPGA).

The inventive method is not limited to rating the quality of a test program for integrated circuits simulated by means of a computer. The method can also be used to rate the quality of computer programs. In this case, the term "integrated circuit" is to be understood to mean a computer program and the term "mutated integrated circuit" is to be understood to mean a mutated computer program. In addition, the term "simulation" can be replaced by "execution".

This case therefore involves a method for rating the quality of a test program for a computer program, comprising
(a) provision of a first file which describes a computer program;
(b) execution of a mutated computer program which is obtained by incorporating mutations into the computer program described in the first file;
(c) supply of input values to the mutated computer program and recording of the output values produced for these input values by the mutated computer program;
(d) comparison of the output values produced by the mutated computer program with expected values which are provided by the test program, where the expected values have been generated in a reference system; and
(e) rating of the quality of the test program on the basis of the comparison results.

The invention is explained in more detail below with reference to drawings, in which FIG. 1 shows a flowchart to illustrate a first embodiment of the inventive method;

FIG. 2 shows the first file in the form of an HDL file for an exemplary unmutated integrated circuit;

FIG. 3 shows the second file, obtained from the first file, in the form of an HDL file for a mutated integrated circuit;

Figure 1:
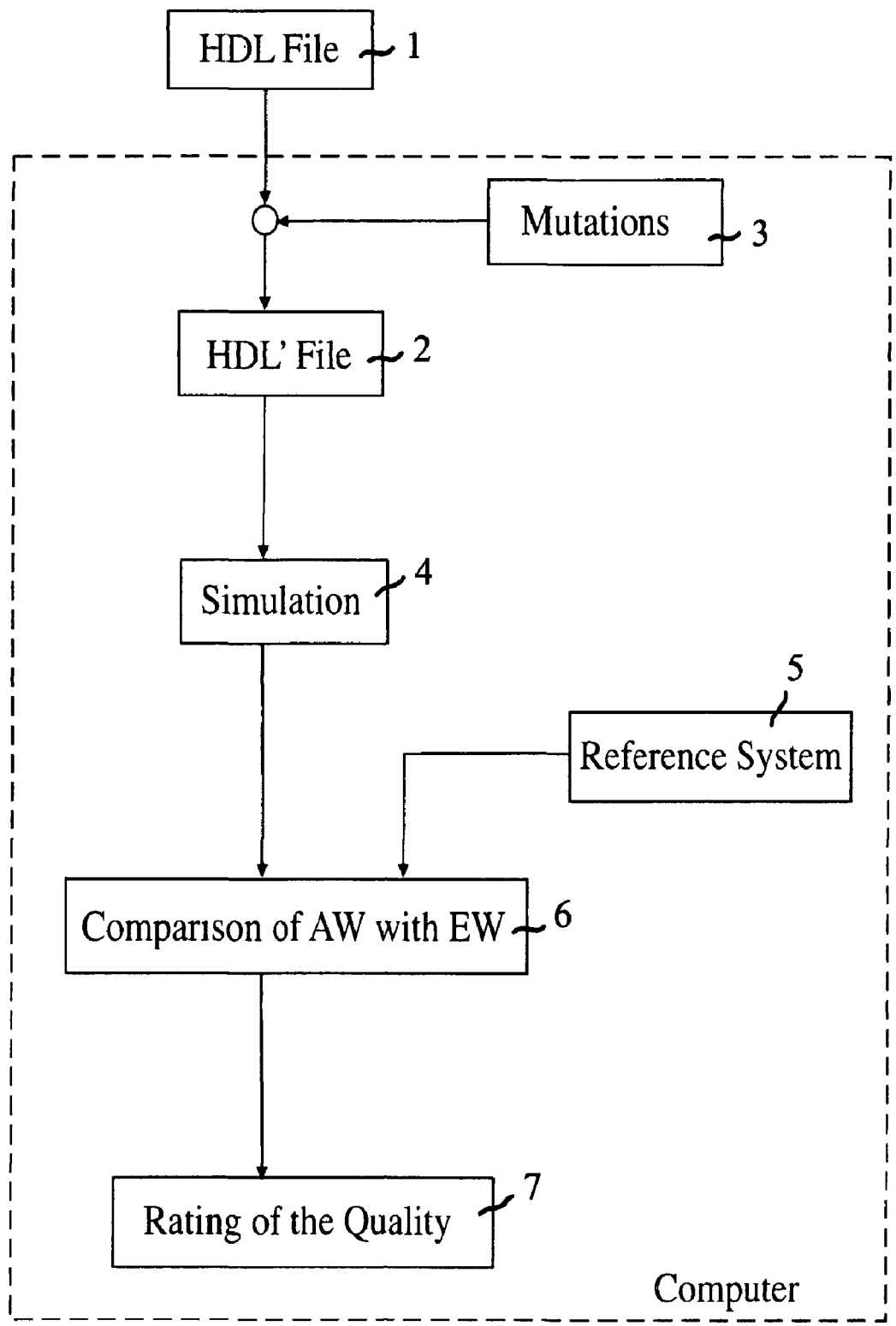

In accordance with FIG. 1, which shows a first embodiment of the inventive method, the first file is an HDL file 1. The HDL file 1 describes an integrated circuit which may contain undeliberate mutations. The first file is transferred to the computer, which is shown by a dashed line. In the computer, the HDL file 1 is used to produce a mutated HDL file which represents the second file and which is referred to as HDL' file 2. To this end, functional mutations 3 which are provided by the test program are incorporated into the HDL file 1 in the manner described. The HDL' file 2 obtained describes a mutated integrated circuit which is based on the integrated circuit described in the HDL file 1 but additionally contains mutations.

The mutated integrated circuit described in the HDL' file 2 is simulated by the simulation program. During the simulation, a control program 52 (in this regard see FIG. 5) activates the incorporated mutations in succession and—if expedient—in a prescribed order, so that only one mutation is ever active. The test program 70 performs the tests which are able to address the respective activated mutation. These tests have been combined into test sets. The test program 70 takes the selected test as a basis for generating input values EgW which are supplied to the simulated mutated integrated circuit 61. These input values EgW are processed by the simulated mutated integrated circuit 61 and in so being are converted into output values AW. The output values AW are then compared by the test program 70 with expected value EW (reference symbol 6 in FIG. 1) which are generated by the test program 70 using a reference system 5 (reference symbol 72 in FIG. 5). The tests combined in the test set are performed in succession until a test results in output values AW which differ from the expected values EW. Next, the activated mutation is deactivated and—if not all of the incorporated mutations have been tested—the next mutation is activated, which in turn has an associated test set containing tests which address this now activated mutation.

It is therefore not necessary to perform all the tests which have been combined in a test set. Performance of the tests in a test set for a mutation can be terminated as soon as the output values which are obtained when a test is performed differ from the expected values. If it is discovered that a test in a test set actually addresses the associated mutation (which is reflected in the lack of a match between the output values and the expected values) then this discovery can be used to conclude that the test program provides at least one test which is able to test the associated mutation. This case is a positive test result, since the test program identifies the mutation. The quality of the test program is therefore good in relation to the one mutation. If no test in the test set produces output values which differ from the expected values then the active mutation has had no influence on the processing of the input values to form output values. This case is a negative test result, since the test program does not identify the mutation. The quality of the test program is therefore poor in relation to the one mutation.

The number of mutations identified in this manner by the test program can be used to ascertain the quality of the test program (reference symbol 7 in FIG. 1). If each mutation is identified then the quality of the test program is good. If not all mutations are identified then this result is a poorer result, but the ratio of identified mutations to unidentified mutations can be used to calculate a value for the quality which is in turn compared with a prescribed value. If the calculated value for the quality is higher than the prescribed value then the test program can be rated as good.

FIG. 2 shows an example of a first file in the form of an HDL file 1 from which, as FIG. 3 shows, a mutated HDL' file 2 has been obtained by virtue of mutations having been incorporated into the HDL' file 1.

The HDL file shown in FIG. 2 contains the complete HDL code for a 4-bit up/down counter which has the data outputs C0, C1, C2 and C3 and counts from 0 to 15 or in the opposite direction. It comprises the following data inputs:

Reset: when Reset=0, the counter is reset to the value 0 if a rising clock edge is present (i.e. clock changes from 0 to 1);

Clock: clock input—rising edge (also called "clock edge")

UpDown: the counter adds when UpDown=1; it subtracts when UpDown=0

Count: the value of the counter is increased by one upon the rising clock edge when Count=1, Reset=1 and UpDown=1; the value of the counter is decreased by one upon the rising clock edge when Count=1, Reset=1 and UpDown=0; the value of the counter is not altered when Count=0 and Reset=1.

The HDL' file shown in FIG. 3 contains functional mutations which have been inserted into the HDL file shown in FIG. 2. The HDL' code describes a 4-bit up/down counter which has the data outputs C0, C1, C2 and C3 and counts from 0 to 15 or in the opposite direction. It comprises the following data inputs:

Reset: when Reset=0, the counter is reset to the value 0 if a rising clock edge is present (i.e. clock changes from 0 to 1);

Clock: clock input—rising edge

UpDown: the counter adds when UpDown=1; it subtracts when UpDown=0

Count: the value of the counter is increased by one upon the rising clock edge when Count=1, Reset=1 and UpDown=1; the value of the counter is decreased by one upon the rising clock edge when Count=1, Reset=1 and UpDown=0; the value of the counter is not altered when Count=0 and Reset=1.

Em allows one mutation emi from the mutations emn (n 1 to 13) inserted into the HDL' file to be activated while all other mutations are inactive.

The individual mutations are encoded in the HDL' file 2 in binary form as em="0011" (em1), em=2"0100" (em2) . . . em="1110" (em13).

Figure 4:
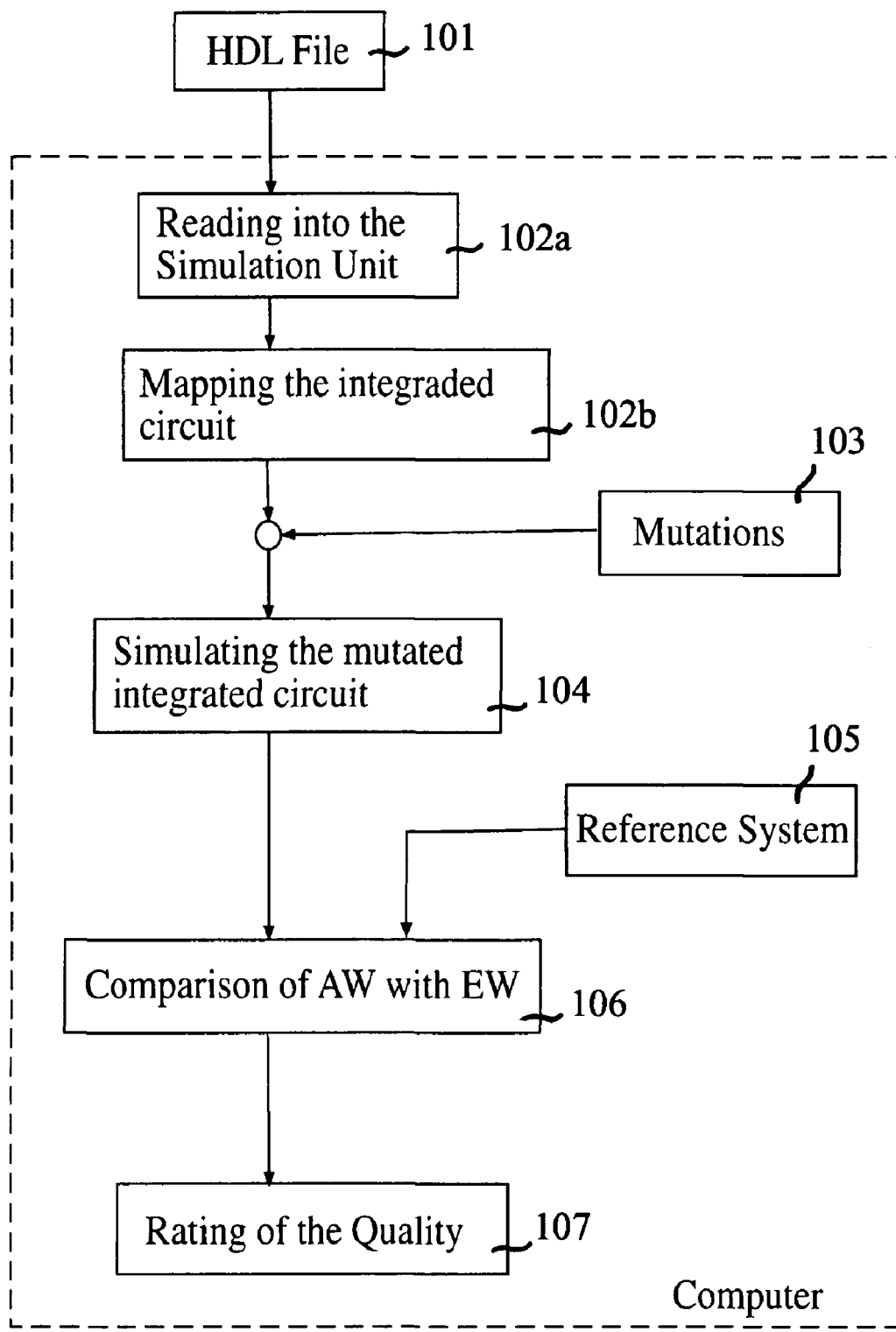
FIG. 4 shows a flowchart to illustrate a second embodiment of the invented method.

According to FIG. 4, which shows a second embodiment of the inventive method, the first file is an HDL file 101. The HDL file 101 describes an integrated circuit which may contain undeliberate mutations. The first file is transferred to the computer, which is shown by a dashed line, is read into the simulation unit of the computer (reference symbol 102a), and there the integrated circuit is mapped (reference symbol 102b). The mapped integrated circuit is used to produce a mutated integrated circuit by incorporating functional mutations 103, which are provided by the test program, in the manner described. A mutated integrated circuit is obtained which is based on the integrated circuit described in the HDL file 1 but which additionally contains mutations.

The mutated integrated circuit is simulated by the simulation unit (reference symbol 104). During the simulation 104, a control program 52 (in this regard see FIG. 5) activates the incorporated mutations in succession and—if expedient—in a prescribed order, so that only one mutation is ever active. The test program performs the tests which are able to address the respective activated mutation. These tests have been combined into test sets. The test program 70 takes the selected test as the basis for generating input values EgW which are supplied to the simulated mutated integrated circuit 61. These input values EgW are processed by the simulated mutated integrated circuit 61 and in so being are converted into output values AW. The output values AW are then compared by the test program 70 with expected values EW (reference symbol 106 in FIG. 4), which are generated by the test program using a reference system 105 (reference symbol 72 in FIG. 5). The tests combined in the test set are performed in succession until a test results in output values which differ from the expected values. Next, the activated mutation is deactivated and—if not all of the incorporated mutations have been tested—the next mutation is activated, which in turn has an associated test set containing tests which address this now activated mutation.

It is therefore not necessary to perform all the tests which have been combined in a test set. Performance of the tests in a test set for a mutation can be terminated as soon as the output values which are obtained when a test is performed differ from the expected values. If it is discovered that a test in a test set actually addresses the associated mutation (which is reflected in the lack of a match between the output values and the expected values) then this discovery can be used to conclude that the test program provides at least one test which is able to test the associated mutation. This case is a positive test result, since the test program identifies the mutation. The quality of the test program is therefore good in relation to the one mutation. If no test in the test set produces output values which differ from the expected values then the active mutation has had no influence on the processing of the input values to form output values. This case is a negative test result, since the test program does not identify the mutation. The quality of the test program is therefore poor in relation to the one mutation.

The number of mutations identified in this manner by the test program can be used to ascertain the quality of the test program (reference symbol 107 in FIG. 1). If each mutation is identified then the quality of the test program is good. If not all of the mutations are identified then this result is a poorer result, but the ratio of identified mutations to unidentified mutations can be used to calculate a value for the quality which is in turn compared with a prescribed value. If the calculated value for the quality is higher than the prescribed value then the test program can be rated as good.

Figure 5:
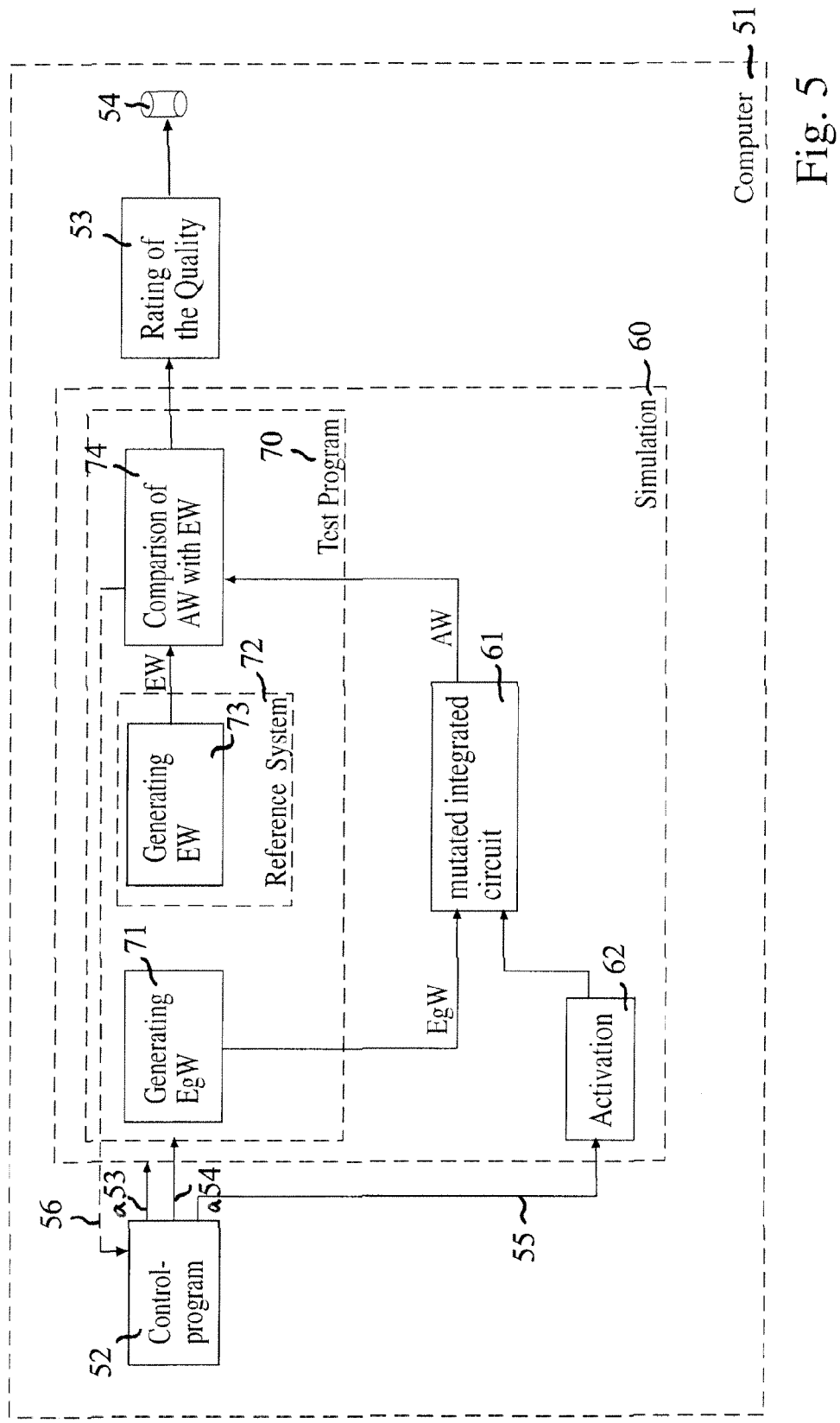
FIG. 5 shows a schematic illustration of the principle on which the invention is based.

FIG. 5 shows a schematic illustration of a computer 51 which comprises a simulation program (not shown), a control program 52, a program 53 for rating the quality of the test program on the basis of the number of identified and the number of unidentified mutations, and a device 54 for outputting the rating result. The simulation program simulates the mutated integrated circuit 61, which can be obtained on the basis of the embodiments shown in FIG. 1 and FIG. 4. The simulation program also executes the test program 70. The execution of the test program 70 and the simulation of the mutated integrated circuit 61 are combined as a simulation 60. The test program 70 generates 71 the input values EgW for each test to be performed and generates 73 the expected values EW using a reference system 72. In addition, it can perform the comparison 74 of the output values AW generated by the mutated integrated circuit, the comparison also being able to be performed outside of the test program 70 by the computer 51.

The control program 52 controls the simulation 60 (arrow a53) and the test program 70 (arrow a54). It also activates and deactivates (arrow 55) the mutations which the mutated integrated circuit 61 contains. It instructs the test program to perform the tests which are associated with the activated mutation.

On the basis of the stipulations of the control program 52, the test program 70 performs the tests for the mutations activated by the control program 52, to which end it supplies the mutated integrated circuit 61 with input values EgW. The output values AW obtained from the mutated integrated circuit 61 for the input values EgW are supplied back to the test program 70, provided that the comparison 74 is to be performed by the test program and is not performed at another location by the computer 51. When the output values AW are supplied to the test program 70 it performs a comparison 74 between the output values AW obtained for the activated mutation and expected values EW. The comparison result is used to perform the rating 53 of the quality of the test program 70 and a report is output using a suitable means 54, for example a monitor or a printer.

The result of the comparison is also transmitted to the control program 52, which, if the output values AW obtained for an activated mutation differ from the expected values EW, terminates performance of the tests associated with this mutation, deactivates the previously activated mutation and can activate the next mutation (dashed arrow 56).

The invention claimed is:

1. A method for rating the quality of a test program for integrated circuits simulated by means of a computer, comprising
   (a) provision of a first file which describes an integrated circuit;
   (b) simulation of a mutated integrated circuit which is obtained by incorporating mutations into the integrated circuit described in the first file, where only one of the mutations is ever active, while the other mutations are inactive, and where the mutations are activated in succession;
   (c) supply of input values to the mutated integrated circuit and recording of the output values produced for these input values by the mutated integrated circuit;
   (d) comparison of the output values produced by the mutated integrated circuit with expected values which are provided by the test program, where the expected values have been generated in an independent reference system; and
   (e) rating of the quality of the test program on a basis of the comparison results.

2. The method as claimed in claim 1, wherein step (b) comprises:
   (b1) production of a second file which describes the mutated integrated circuit from the first file by incorporating the mutations into the first file; and
   (b2) simulation of the mutated integrated circuit.

3. The method as claimed in claim 1, wherein step (b) comprises:
   (b1) reading of the first file into the simulation program of the computer;
   (b2) mapping of the integrated circuit described in the first file in the simulation unit;
   (b3) incorporation of the mutations into the integrated circuit mapped in the simulation unit, which gives the mutated integrated circuit; and
   (b4) simulation of the mutated integrated circuit.

4. The method as claimed in claim 1, wherein the first file comprises a multiplicity of subfiles which together describe the mutated integrated circuit.

5. The method as claimed in claim 1, wherein incorporation of the mutations into the integrated circuit comprises:
   (i) analysis of the first file in order to find locations in the first file at which mutations are incorporated and to determine, for each location found, a type of mutation which brings about a change in a behavior of the integrated circuit at this location;
   (ii) analysis of tests that the test program is able to execute in order to select the tests which provide input values that address a mutation; and
   (iii) selection of the mutations which bring about a change in the behavior of the integrated circuit at a location found in accordance with step (i) and which are addressed by one of the tests, and production of the mutated integrated circuit.

6. The method as claimed in claim 5, further comprising compilation of the tests which can address one of the selected mutations at least once to form a test set.

7. The method as claimed in claim 1, wherein the result of the comparison is negative if the output value obtained for a mutation equates to the expected value generated for the output value.

8. The method as claimed in claim 7, wherein the result of the comparison is positive if the output value obtained for a mutation is not equal to the expected value generated for the output value.

9. The method as claimed in claim 8, wherein the quality of the test program is ascertained from a ratio of the number of positive comparison results to the number of negative comparison results.

10. The method as claimed in claim 9, wherein the quality of the test program is rated as good if a positive comparison result is obtained for each incorporated mutation.

11. The method as claimed in claim 9, wherein the quality of the test program is rated as good if the number of mutations for which a positive comparison result is obtained exceeds a prescribed value.

12. The method as claimed in claim 7, wherein if the result of the comparison for a mutation is negative then the expected value for this mutation is altered and then steps (b) to (e) are repeated.

13. The method as claimed in claim 7, wherein if the result of the comparison for a mutation is negative then the first file is altered and then steps (b) to (e) are repeated.

14. The method as claimed in claim 7, wherein if the result of the comparison for a mutation is negative then tests are selected which address this mutation and provide altered input values in comparison with the previous tests, and then steps (b) to (e) are repeated.

15. The method as claimed in claim 1, wherein the mutated integrated circuit is implemented using a hardware accelerator.

* * * * *